(12) United States Patent
Nunokawa

(10) Patent No.: US 6,791,127 B2
(45) Date of Patent: Sep. 14, 2004

(54) SEMICONDUCTOR DEVICE HAVING A CONDENSER CHIP FOR REDUCING A NOISE

(75) Inventor: Hideo Nunokawa, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/073,316

(22) Filed: Feb. 13, 2002

(65) Prior Publication Data

US 2003/0047758 A1 Mar. 13, 2003

(30) Foreign Application Priority Data

Aug. 10, 2001 (JP) ........................................ 2001-244840

(51) Int. Cl.⁷ .............................................. H01L 27/10
(52) U.S. Cl. ........................ 257/203; 257/206; 257/207; 257/208; 257/691
(58) Field of Search ................................ 257/202, 203, 257/204, 206, 207, 208, 210, 686, 691, 723, 724, 777; 438/107, 109, 128, 129, 587, 598

(56) References Cited

U.S. PATENT DOCUMENTS 5,677,570 A * 10/1997 Kondoh et al. ............. 257/691
5,949,098 A * 9/1999 Mori .......................... 257/211
6,328,176 B1 * 12/2001 Zivic .......................... 257/355
6,339,234 B1 * 1/2002 Takizawa .................... 257/203
6,395,605 B1 * 5/2002 Zivic .......................... 438/257
2002/0030268 A1 * 3/2002 Sakamoto et al. .......... 257/700

FOREIGN PATENT DOCUMENTS

| JP | 58-33952 | * 2/1983 | |
| JP | 02-250038 | * 10/1990 | ............... 27/12 |
| JP | 7-307412 | 11/1995 | |
| JP | 9-293824 | 11/1997 | |

* cited by examiner

*Primary Examiner*—Steven Loke
*Assistant Examiner*—Quang Vu
(74) *Attorney, Agent, or Firm*—Armstrong, Kratz, Quintos, Hanson & Brooks, LLP

(57) ABSTRACT

A semiconductor chip has a circuit block, a power supply line and a ground line. A condenser chip in which a noise reduction condenser connected to the circuit block is stacked on the semiconductor chip. Because the condenser chip is stacked on the semiconductor chip, it is not necessary to provide a noise reduction condenser on the semiconductor chip and also not to provide a noise reduction condenser on a substrate on which the semiconductor chip is mounted.

14 Claims, 7 Drawing Sheets

SEMICONDUCTOR DEVICE HAVING A CONDENSER CHIP FOR REDUCING A NOISE

BACKGROUND OF THE INVENTION

1. Field of the Invention

This invention generally relates to a semiconductor device, and more particularly, to a semiconductor device, which reduces unnecessary radiation.

In a semiconductor device such as an IC for an automobile, there is a problematic unnecessary radiation as a noise emitted from circuits. In order to reduce the unnecessary radiation, a new method to solve the problem is needed.

2. Description of the Related Art

A conventional semiconductor device has a bypass condenser (capacitor) as a means to reduce a noise emitted from a portion between a power supply and GND (ground) within an integrated circuit (IC). A structure having the bypass condenser can be achieved by two different formations as shown in FIG. 1 and FIG. 2.

In FIG. 1, a bypass condenser 4 is placed between a semiconductor chip 1 and bonding pads (electrode terminals) 3 on a substrate 2. The bypass condenser 4 reduces the noise by bypassing between one of the bonding pads 3 (Vcc) serving as a power supply terminal and one of the bonding pads 3 (Vss) serving as a ground terminal. Square areas in the central region of the semiconductor chip 1 are circuit blocks formed on the semiconductor chip 1. The structure in FIG. 1 has four circuit blocks A, B, C and D. For example, the bypass condenser 4 is attached to the mounting substrate 2 by being inserted into a slot formed on the surface of the substrate 2. Electrode pads 1a on the semiconductor chip 1 and bonding pads 3 on the substrate 2 are connected through bonding wires 5.

In FIG. 2, on the other hand, a bypass condenser 6 is provided within the semiconductor chip 1. The bypass condenser 6 is a condenser (MOS capacitor) made by metal-oxide-film and is formable in a manufacturing process of the semiconductor chip 1. The bypass conductor 6 reduces a noise by bypassing between a power supply line (Vcc line) 8 and a grounding line (Vss line) 9 that are connected to a circuit formed within the semiconductor chip 1.

A radiation noise from a semiconductor device increases in proportion to an area of a current loop formed by a circuit being bypassed by a bypass condenser. In the conventional structure of FIG. 1, the noise is not effectively reduced because of a relatively large area of a current loop. As shown in FIG. 1, the bypass condenser 4 is connected between the power supply terminal and the grounding terminal on the substrate 2. As indicated by an arrow in FIG. 1, the current loop includes a circuit, which extends from the power supply terminal to the grounding terminal. Thus, the area of the current loop is large. In addition, a manufacturing cost rises and the number of parts increases because a separate condenser is attached to the substrate 2 as the bypass condenser 4.

In FIG. 2, an area of a current loop is smaller than that shown in FIG. 1 because a condenser is formed within the semiconductor chip 1 so as to be a bypass condenser. The bypass condenser 6 formed within the semiconductor chip 1 is formed by a transistor having a MOS capacity. Because the MOS capacity cannot be included in a transistor region, the bypass condenser 6 is needed to be provided in a wiring region or a vacant region within the semiconductor chip 1.

In order to form a bypass condenser having a comparatively large capacity within the semiconductor chip 1, a space must be reserved for forming the bypass condenser 6. Thus, there is a problem that a size of chip becomes large. Another problem is a cost increase because of a declining performance in processing speed caused by an increased line capacity or low yield.

In the case of forming a bypass condenser within a semiconductor chip, in chip design step, it is difficult to predict an effect of the bypass condenser. That is, an effective capacity of a bypass condenser and a circuit block, to which the bypass condenser is provided, can not be exactly predicted. The capacity of the bypass condenser to be inserted can be exactly determined by measuring the radiated noise so as to determine which circuit block radiates a large noise, after making a trial semiconductor chip. Accordingly, trial semiconductor chips must be produced several times while changing a position and a capacity of the bypass condenser. Thus, there is a problem in that a long time is required for developing a semiconductor device.

SUMMARY OF THE INVENTION

It is a general object of the present invention to provide an improved and a useful semiconductor device which solves the above-mentioned problems.

A more specific object of the present invention is to reduce a radiating noise effectively without increasing a plane area of a semiconductor chip.

In order to achieve the above-mentioned object, there is provided according to one aspect of the present invention a semiconductor device comprising:

a semiconductor chip having a circuit block, a power supply line and a ground line; and a condenser chip in which a noise reduction condenser connected to said circuit block is formed, wherein the condenser chip is stacked on said semiconductor chip.

According to the present invention, because the condenser chip is stacked on the semiconductor chip as a separate part, it is not necessary to provide a noise reduction condenser on the semiconductor chip, and it is also not necessary to provide the noise reduction condenser on the substrate on which the semiconductor chip is mounted. Thus, a condenser having a desired capacity can be connected to the semiconductor chip without increasing the plane area of the semiconductor device, so that the noise radiated from a circuit of the semiconductor chip can be reduced.

Additionally, in the semiconductor device according to the present invention, a plurality of circuit blocks may be formed in the semiconductor chip, and the condenser chip may have a plurality of condensers corresponding to the circuit blocks.

According to the present invention, because a plurality of condensers are formed in the condenser chip, the condensers can be connected to a plurality of circuit blocks individually.

Additionally, in the semiconductor device according to the present invention, a plurality of circuit blocks may be formed in the semiconductor chip, and a plurality of the condenser chips may be provided corresponding to the circuit blocks.

According to the present invention, because a plurality of the condenser chips are provided to be stacked on the semiconductor chip, the condensers can be connected to a plurality of circuit blocks individually.

Additionally, in the semiconductor device according to the present invention, the semiconductor chip may have a first power supply pad provided on a connecting line extending from one of the power supply line and the ground line to the circuit block; and the condenser chip may have a second electrode pad connected the condenser, and the second electrode pad of the condenser chip may be electrically connected to the first electrode pad of the semiconductor chip through a bonding wire.

According to the present invention, the condenser chip can be easily stacked and mounted on the semiconductor chip by a conventional bonding wire.

Additionally, in the semiconductor device according to the present invention, the semiconductor chip may have a first power supply pad provided on a connecting line extending from one of the power supply line and the ground line to the circuit block; and the condenser chip has a second electrode pad connected the condenser, and the condenser chip may be connected to the first electrode pad of the semiconductor chip by flip chip bonding.

According to the present invention, the condenser chip can be easily stacked and fixed on the semiconductor chip by a conventional flip chip bonding. Also, an increase in a thickness of the semiconductor device in a vertical direction can be reduced.

Additionally, in the semiconductor device according to the present invention, the noise reduction condenser of the condenser chip may be formed by a MOS capacity.

According to the present invention, the condenser chip can be easily manufactured by a conventional semiconductor manufacturing technique.

Additionally, in the semiconductor device according to the present invention, the semiconductor chip may have a third electrode pad other than the first electrode pad connected to the circuit block;

the condenser chip may have a fourth electrode pad other than the second electrode pad connected to the condenser; and an inductor connected to at least one of the power line and the ground line may be formed by connecting the fourth electrode pad of the condenser chip to the third electrode pad of the semiconductor chip by a bonding wire.

According to the present invention, the inductor connected to at least one of the power line and the ground line can be formed easily by a bonding wire, and a high frequency component of the noise generated inside the semiconductor chip can be reduced effectively. Thus, a noise entering one of the power supply line and the ground line can be reduced.

Additionally, in the semiconductor device according to the present invention, a plurality of the fourth electrode pads of the condenser chip may be provided and a plurality of the third electrode pads of the semiconductor chip may be provided; and the inductor may be formed by alternately and sequentially connecting the fourth electrode pads of the condenser chip and the third electrode pads of the semiconductor chip by bonding wires.

According to the present invention, because a plurality of bonding wires for forming the inductance can be provided in series, the inductance can be increased and the noise can be reduced more effectively.

In order to achieve the above-mentioned object, there is also provided according to another aspect of the present invention a semiconductor device comprising: a first semiconductor chip having a circuit block, a power supply line and a ground line; and a second semiconductor chip stacked on the first semiconductor chip, wherein the first semiconductor chip has an electrode pad separated from a circuit formed within the first semiconductor chip;

the second semiconductor chip has an electrode pad separated from a circuit formed within the second semiconductor chip; and an inductor connected to at least one of the power line and the ground line is formed by connecting the electrode pad of the first semiconductor chip to the electrode pad of the second semiconductor chip by a bonding wire.

According to the present invention, the inductor connected to at least one of the power line and the ground line can be formed easily by a bonding wire, and a high frequency component of the noise generated inside the first semiconductor chip can be reduced effectively. Thus, the noise entering one of the power supply line and the ground line can be reduced.

Additionally, in the semiconductor device according to the present invention, a plurality of the electrode pads of the first semiconductor chip may be provided and a plurality of the electrode pads of the second semiconductor chip may be provided; and an inductor may be formed by alternately and sequentially connecting the electrode pads of the first semiconductor chip and the electrode pads of the second semiconductor chip by bonding wires.

According to the present invention, because a plurality of bonding wires for forming the inductance can be provided in series, the inductance can be increased and the noise can be reduced more effectively.

Other objects, features and advantages of the present invention will become more apparent from the following detailed description when read in conjunction with the accompanying drawings.

DESCRIPTION OF THE PREFERRED EMBODIMENTS

A description will now be given, with reference to the drawings, of embodiments according to the present invention.

First Embodiment

Figure 1:
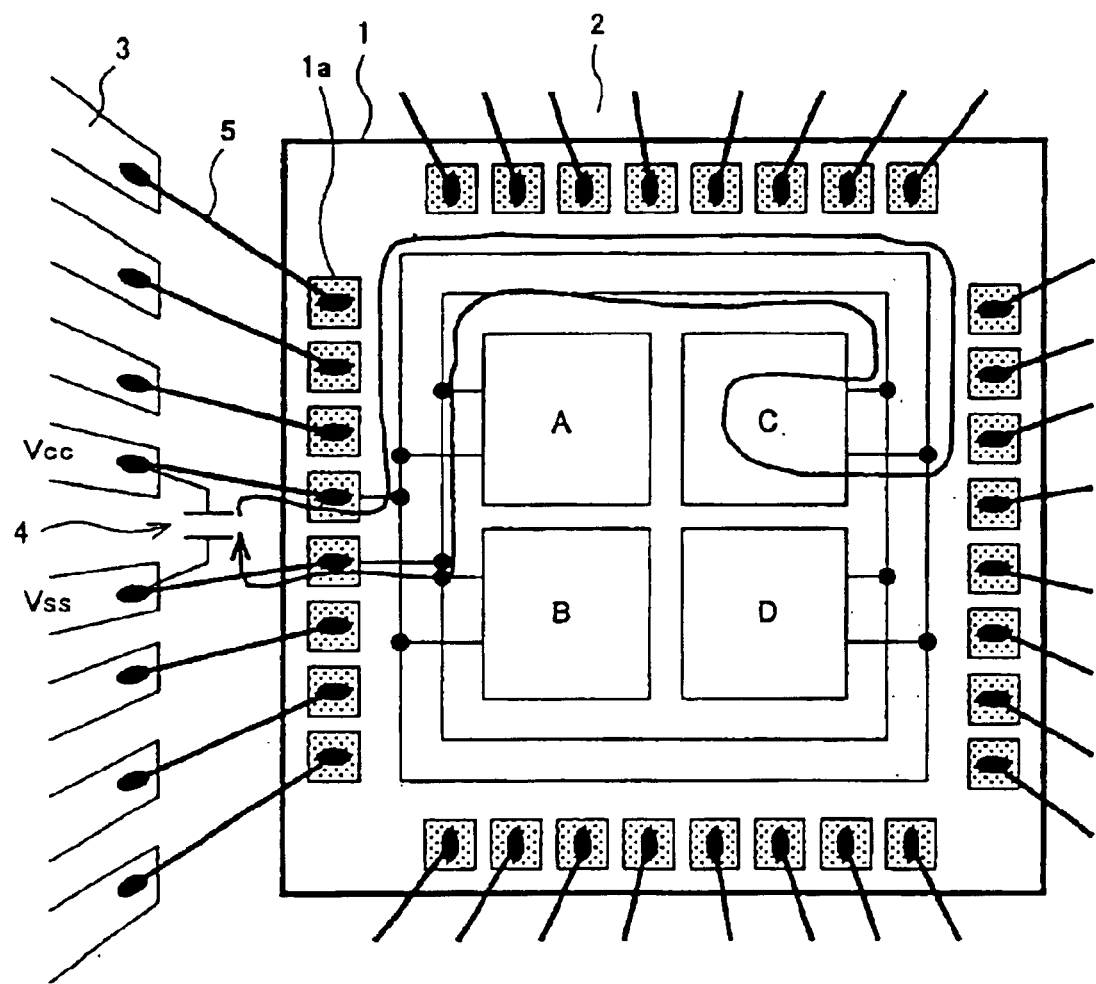
FIG. 1 is a plan view of a structure of a conventional semiconductor device having a bypass condenser.
Figure 2:
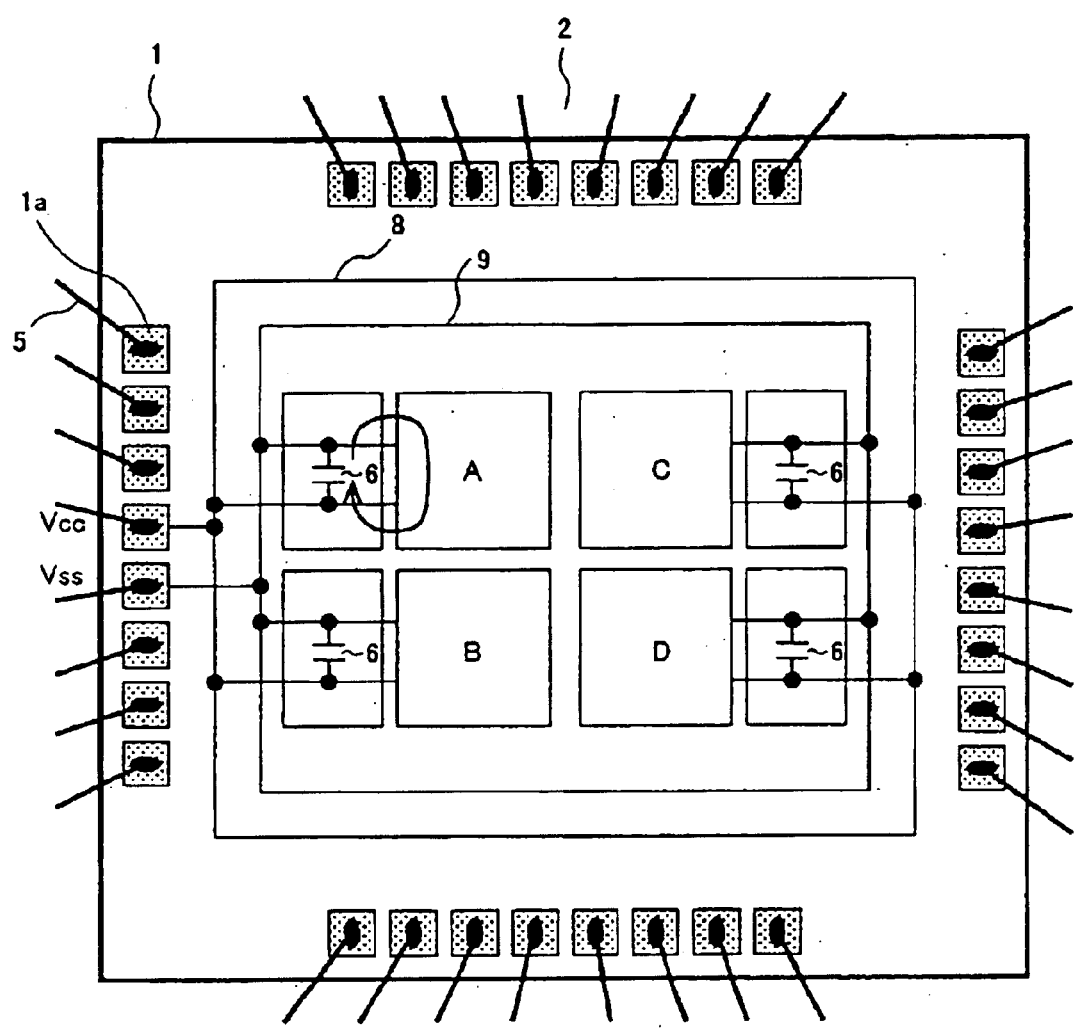
FIG. 2 is a plan view of a structure of another conventional semiconductor device having a bypass condenser.
Figure 3A:
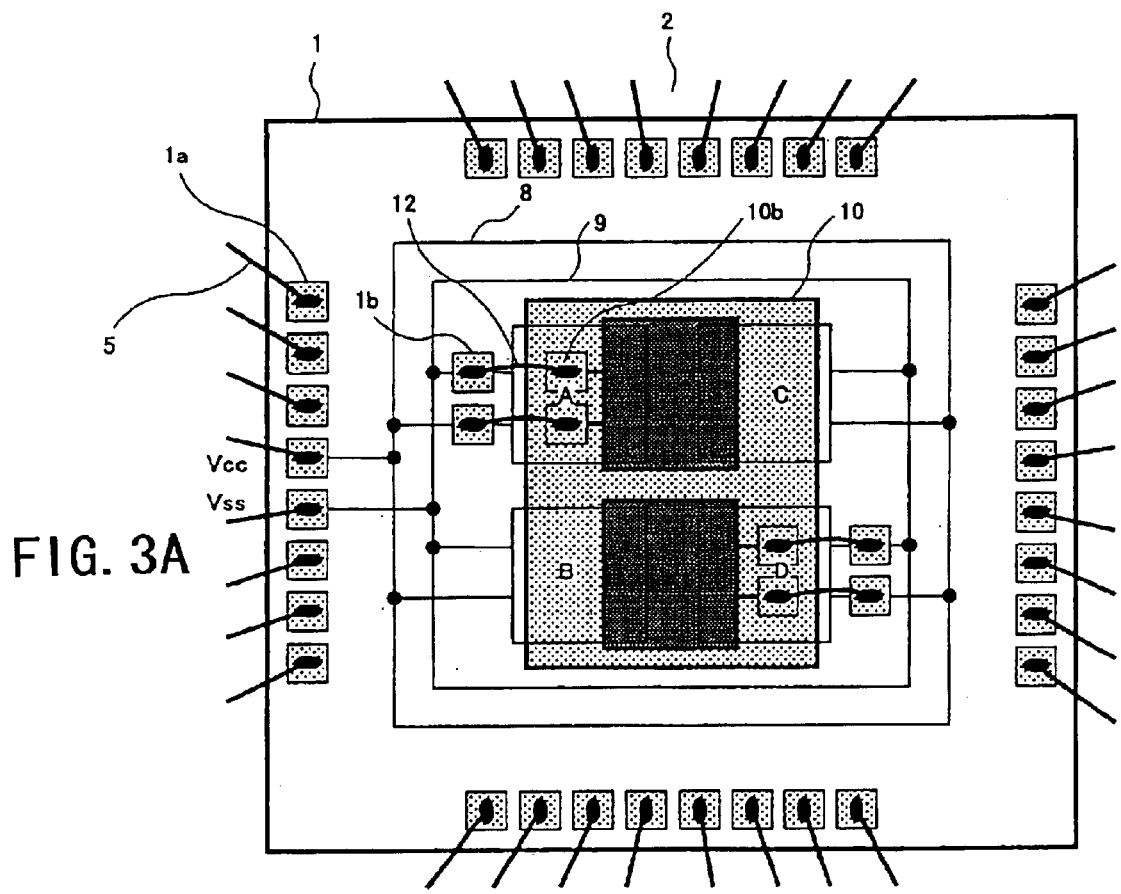
FIG. 3A is a plan view of a structure of a semiconductor device having a semiconductor chip according to a first embodiment of the present invention.
Figure 3B:
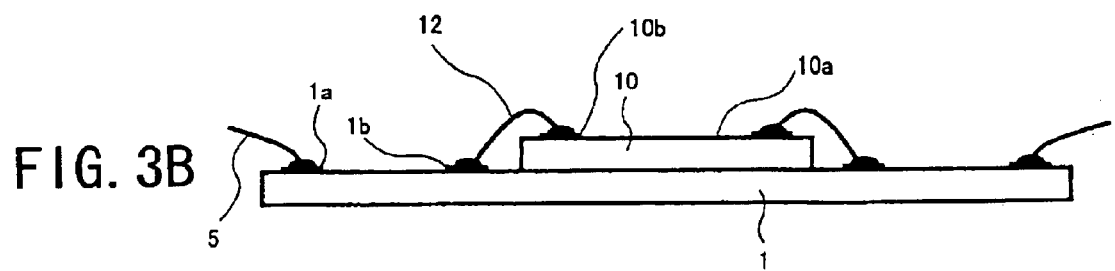
FIG. 3B is a side view of the structure of the semiconductor device according to the first embodiment of the present invention.

FIG. 3A is a plan view of a structure of a semiconductor device having a semiconductor chip according to a first embodiment of the present invention. FIG. 3B is a side view of the structure of the semiconductor device according to the first embodiment of the present invention. Composition parts shown in FIG. 3, that are identical or equivalent to FIG. 1 and FIG. 2, are referenced by the same characters and each explanation of the same composition part will be omitted.

The semiconductor device according to the first embodiment of the present invention has a layer of a condenser chip 10 on the semiconductor device 1. A condenser serving as a bypass condenser is formed in the condenser chip 10 by using a semiconductor manufacturing technology. The condenser chip 10 is smaller than the semiconductor chip 1 so that the condenser chip 10 can be stacked on the central region of the semiconductor chip 1. That is, the layer of the condenser chip 10 can be placed within a region of electric pads 1a arranged around the semiconductor chip. The region is provided with four circuit blocks A, B, C and D of the semiconductor chip 1.

In the condenser chip 10, a required number of condensers are formed according to the number of the circuit blocks of the semiconductor chip 1. In the embodiment of FIG. 3, the circuit block A and the circuit block D of the semiconductor chip 1 need bypass condensers. Thus, two condensers, which relate to the circuit blocks A and D, are formed in the condenser chip 10.

As shown in FIG. 3B, the condenser chip 10 is fixed on the semiconductor chip 1 by insulating adhesive in a state in which a circuit forming surface 10a faces upward. Electrodes 10b formed on the surface having a circuit are connected to electrode pads 1b formed on current paths on the semiconductor chip 1 through bonding wires 12. Electrode pads 1b, which are connected to the condenser chip 10, are formed in positions different from positions of the electrode pads 1a.

That is, electrode pads 1b are provided on a connecting line which extends from a power supply line 8 to the circuit region block A (circuit region C) and on a connecting line which extends from a ground line 9 to the circuit region block A (circuit region C). Positions of the electrode pads 1b are preferably close to the circuit block as much as possible because a size of the electric loop is influenced by the positions of the electrode pads 1b.

As mentioned above, the semiconductor chip 1 having the stacked condenser chip 10 is sealed on the substrate 2 by sealing resin and outer connecting terminals are provided on a back surface of the substrate 2 so as to be formed as an semiconductor device.

In such a structure of the semiconductor device, condensers formed in the condenser chip 10 can be connected to the circuit block A and the circuit block D, which require a bypass condenser. The condensers formed in the condenser chip 10 that act as bypass condensers reduce a noise radiated from the circuit block A and the circuit block D.

Because the condenser chip 10 is stacked on the semiconductor chip1 as a layer in the center region thereof, the condenser chip 10 does not increase an area of the semiconductor device. In addition, the condenser chip 10 can be manufactured individually from the semiconductor chip so as to set a capacity of each condenser with no limitation. Thus, a bypass condenser having a suitable capacity can be connected to each circuit block.

Moreover, the semiconductor chip 1 is merely provided with the electric pads 1b thereon, and the capacity of the bypass condenser can be changed easily by replacing the condenser chip 10. Also, the condenser chip 1 having a standard capacity may be made in advance, so that the condenser chip 1 can be used for different semiconductor chips commonly.

Hereinbelow, a structure of the condenser chip 10 will be explained. The condenser chip 10 has a condenser serving as a bypass condenser and can be formed by a semiconductor manufacturing technology.

Figure 4:
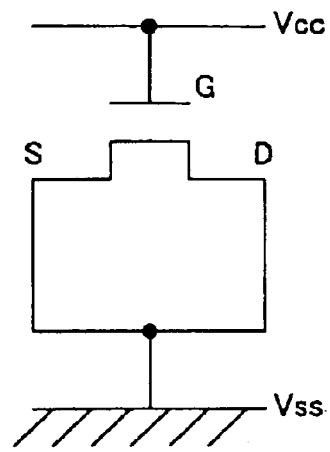
FIG. 4 is a diagram showing a condenser formed in a condenser chip as an electric circuit.
Figure 5:
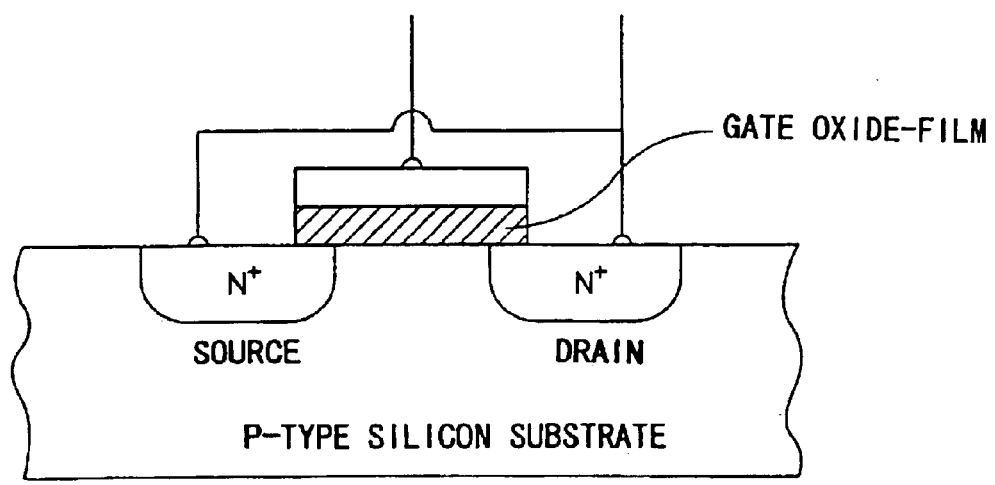
FIG. 5 is an illustration showing a structure of the condenser shown in FIG. 4.

FIG. 4 is a diagram showing a condenser formed in the condenser chip 10 as an electric circuit. FIG. 5 is an illustration showing a structure of the condenser in FIG. 4. As shown in FIGS. 4 and 5, the condenser formed in the condenser chip 10 is formed as a MOS capacity having a transistor structure. In other words, a transistor is formed on a P-type silicon substrate so as to form a condenser by a gate oxide-film. Therefore, the condenser chip 10 can be made easily by a conventional semiconductor manufacturing technology.

Second Embodiment

Figure 6A:
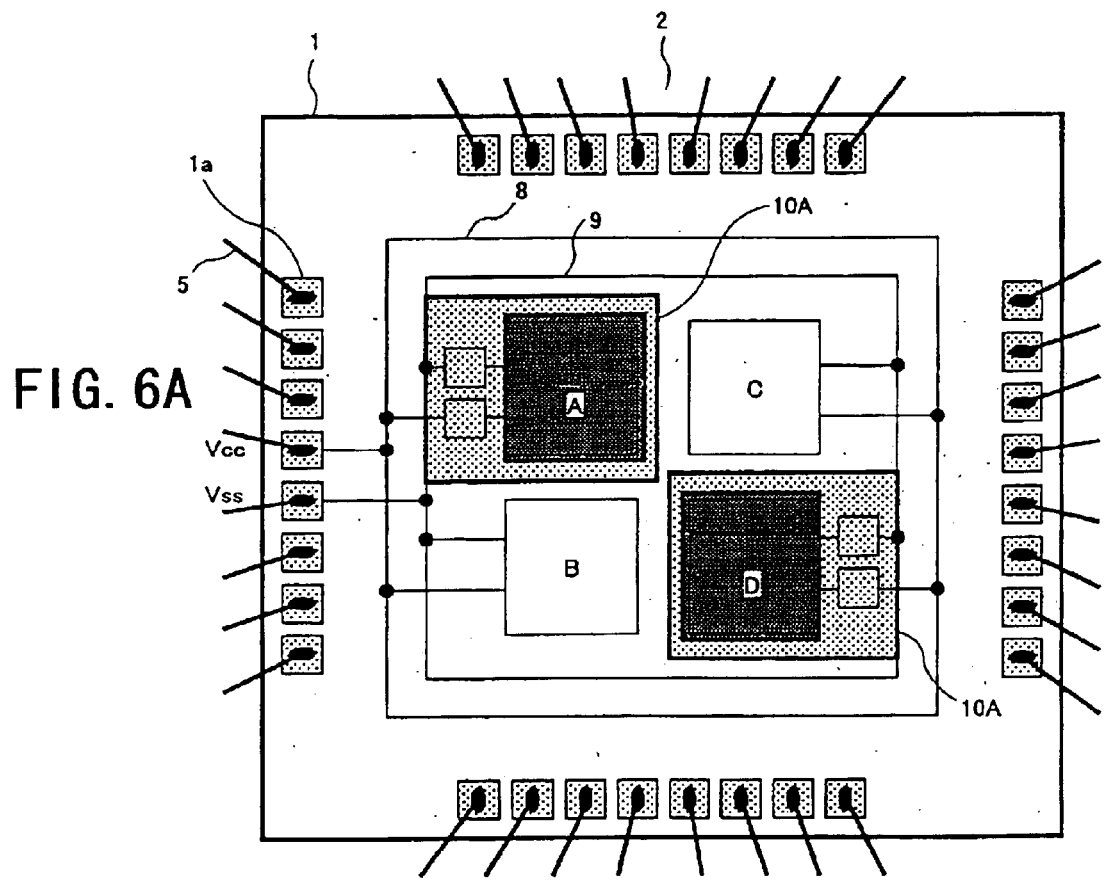
FIG. 6A is a plan view of a structure of a semiconductor chip formed in a semiconductor device according to a second embodiment of the present invention.
Figure 6B:
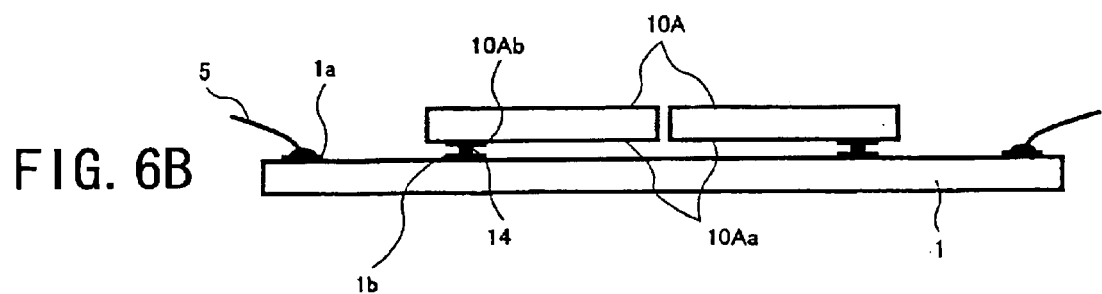
FIG. 6B is a side view of the structure of the semiconductor chip according to the second embodiment of the present invention.

FIG. 6A is a plan view of a structure of a semiconductor chip formed in a semiconductor device according to the second embodiment of the present invention. FIG. 6B is a side view of the structure of the semiconductor chip according to the second embodiment of the present invention. In FIGS. 6A and 6B, parts that are the same as the parts shown in FIG. 3 are given the same reference numerals, and descriptions thereof will be omitted.

In the second embodiment, the semiconductor chip 1 has the same structure as the semiconductor chip 1 shown in FIG. 3, but the structure of the condenser chip is different. In the second embodiment, a condenser chip 10A is provided to each circuit block individually. Each condenser chip 10A is flip chip mounted on the semiconductor chip 1 with a circuit forming surface 10Aa facing downward.

That is, each condenser chip 10A has protruding electrodes 14 such as a solder ball on electrode pads 10Ab, and protruding electrodes 14 are connected to electrode pads 1b of the semiconductor chip 1. In the second embodiment, bonding wires are not required for connecting the condenser chip 10A to the semiconductor chip 1. Thus, a thickness of the semiconductor device in a vertical direction can be reduced, as compared with the semiconductor device shown in FIGS. 3A and 3B.

In addition although, in the second embodiment, the condenser chip 10A is provided to each circuit block individually, as shown in FIG. 3A, a condenser chip, in which a plurality of condensers are formed, may be flip chip mounted to the semiconductor device 1.

Third Embodiment

Figures 7A, 7B:
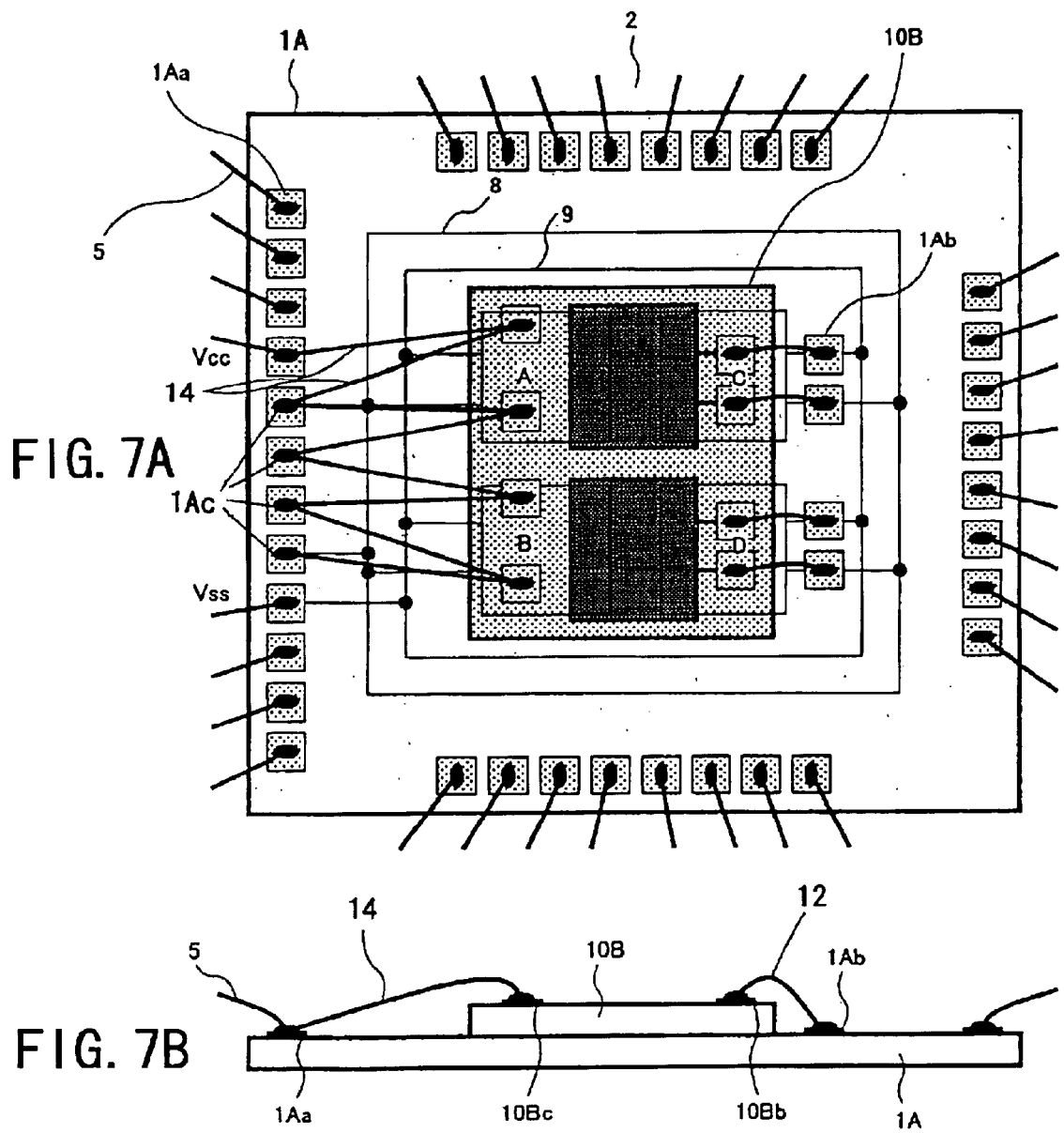
FIG. 7A is a plan view of a structure of a semiconductor chip incorporated in a semiconductor device according to a third embodiment of the present invention.
FIG. 7B is a side view of the structure of the semiconductor device according to the third embodiment of the present invention.
Figure 8:
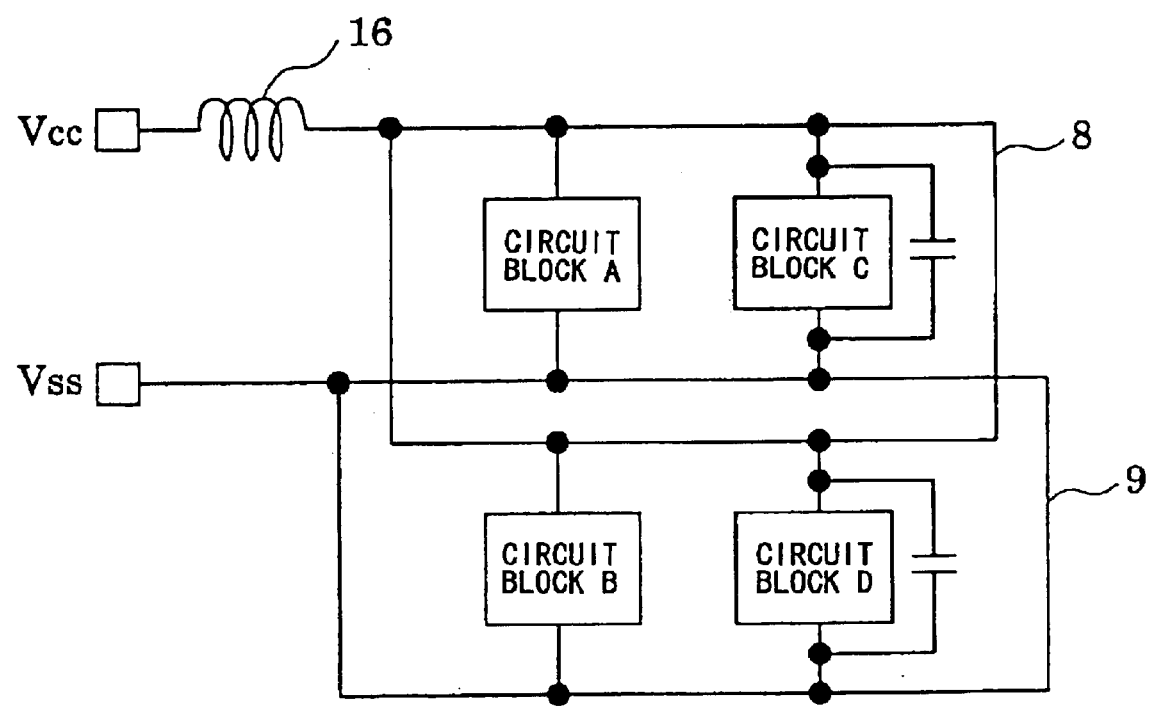
FIG. 8 is a circuit diagram showing a structure of a circuit in the semiconductor chip of FIG. 7.

A third embodiment according to the present invention will be explained referring to FIGS. 7A, 7B and 8. FIG. 7A is a plan view of a structure of a semiconductor chip incorporated in a semiconductor device according to the third embodiment of the present invention. FIG. 7B is a side view of the structure of the semiconductor chip according to the third embodiment of the present invention. In FIGS. 7A and 7B, parts that are the same as the parts shown in FIGS. 3A and 3B are given the same reference numerals, and descriptions thereof will be omitted. FIG. 8 is a circuit diagram showing a structure of a circuit in the semiconductor chip of FIGS. 7A and 7B.

In the third embodiment, a condenser chip 10b is used instead of the condenser chip 10 shown in FIGS. 3A and 3B. Similar to the condenser chip 10, a plurality of condensers are formed in the condenser chip 10B. Electrode pads 10Bb, which are connected to the condensers, are provided on a circuit forming surface 10Ba. Not only electrode pads 10Bb but also electrode pads 10Bc are provided on the circuit forming surface 10Ba. Electrode pads 10Bc are not connected to a circuit formed in the condenser chip 10B, so that both pads are independent from each other.

In the present embodiment, a semiconductor chip 1A is used instead of the semiconductor chip 1 shown in FIGS. 3A and 3B. Although the semiconductor chip 1A and the semiconductor chip 1 have almost the same structure, in addition to the electrode pads 1Aa arranged around the semiconductor chip 1A, there is a difference in that the semiconductor chip 1A are provided with electrode pads 1Ac. Only one of the electrode pads 1Ac is connected to a power supply line 8, but rest of the electrode pads 1Ac are not connected to any parts in the semiconductor chip 1A, and are independent from each other.

A condenser chip 10B is stacked on the semiconductor chip 1A, similar to the structure shown in FIGS. 3A and 3B. Electrode pads 10Bb, which are connected to the condenser, are connected to electrodes 1Ab on the semiconductor chip 1A through bonding wires 12. Thereby, bypass condensers required for circuit blocks in the semiconductor chip 1A are connected, which results in that a radiating noise is reduced.

A connection of the bypass condensers by the condenser chip is the same as that of the structure shown in FIGS. 3A and 3B. In the third embodiment, however, electrode pads 10Bc, which are provided on the condenser chip 10B, and electrode pads 1Aa which are provided on the semiconductor chip 1A, are connected through bonding wires 14.

In an embodiment shown in FIGS. 7A and 7B, four electrode pads 10Bc are provided on the condenser chip 10B, and, corresponding to this, four electrode pads 1Ac are provided on the semiconductor chip 1A. The electrode pads 1Ac of the semiconductor chip 1A are arranged with respect to one of the electrode pads 1Aa serving as a power supply terminal (Vcc). The electrode pad 1Aa serving as a power supply terminal (Vcc) and an electrode pad 10Bc in the uppermost position in FIG. 7A among the four electrode pads 10Bc on the condenser chip 10B are connected through the bonding wire 14.

In addition, the electrode pad 10Bc in the uppermost position and an electrode pad 1Ac nearest to the electrode pad 1Aa as a power supply terminal (Vcc) are connected through the bonding wire 14. Moreover, an electrode pad 1Ac nearest to the electrode pad 1Aa as a power supply terminal (Vcc) and an electrode pad 10Bc immediately below the electrode pad 10Bc in the uppermost position of the condenser chip 10B are connected through the bonding wire 14.

According to the above-mentioned connecting method, four electrode pads 1Ac on the semiconductor chip 1A and four electrode pads 10Bc on the condenser chip 10B are connected through the bonding wires 14. Here, the lowermost electrode pad 10Bc among the four electrode pads 10Bc in FIG. 7A is connected to the power supply line (Vcc line) 8 within the semiconductor chip 1A. Thus, the electrode pad 1Aa serving as the power supply terminal is connected to the power supply line 8 through eight bonding wires 14. The eight bonding wires 14 mentioned before act as an inductor, which is connected to the power supply line so as to attenuate a high frequency component on the power supply line, and reduces a noise.

FIG. 8 shows a circuit formed in the semiconductor chip 1A. The power supply terminal (Vcc) is connected to the power supply line 8 through an inductor 16 made by the bonding wires 14. In the case of using a gold wire having a width of several ten micro meters as the bonding wire, an inductance is 1 nH per 1 mm. Thus, only an inductance of 10 nH is obtained using a bonding wire having a length of 10 mm.

As shown in the third embodiment, however, the bonding wires 14 are folded several times between electrode pads 10Bc on the condenser chip and the electrode pads 1Ac on the semiconductor chip 1A. Thus, a large inductance is provided and a noise reduction effect can be increased. In the structure shown in FIGS. 7A and 7B, the bonding wires 14 are connected to the power supply line 8 by being folded 4 times, so that eight times large inductance can be provided.

In the third embodiment, an inductance, which is formed by the bonding wires 14, is provided not only on a side of the power supply line but also on a side of the ground line. Also, the inductance can be provided on both sides of the power supply line and the ground line.

In the third embodiment, the condenser chip 10B is provided with the electrode pads 10Bc. However, a chip provided with the electrode pads 10Bc is not limited to a condenser chip, and semiconductor chips other than a condenser chip may be used. That is, although a bypass condenser needs to be formed so as to reduce a noise by providing an inductor, it is not always necessary to provide a bypass condenser by stacking a condenser chip as in the above-mentioned first and second embodiments. For example, in a case of a semiconductor device, in which a second semiconductor chip is stacked on a first semiconductor chip, an inductor can be formed as in the above-mentioned embodiment by forming electrodes on both the first and second semiconductor chips for forming the inductor and connecting the electrodes by bonding wires, and the noise reduction effect can be achieved.

The present invention is not limited to the specifically disclosed embodiments, and variations and modifications may be made without departing from the scope of the present invention.

The present application is based on Japanese priority application No. 2001-244840 filed on Aug. 10, 2001, the entire contents of which are hereby incorporated by reference.

What is claimed is:

1. A semiconductor device comprising: a first semiconductor chip having a circuit block, a power supply line and a ground line; and a second semiconductor chip stacked on said first semiconductor chip, wherein said first semiconductor chip has at least one first electrode pad separated from a circuit formed within said first semiconductor chip;

said second semiconductor chip has at least one first electrode pad separated from a circuit formed within said second semiconductor chip; and an inductor connected to at least one of said power line and said ground line is formed by connecting said at least one first electrode pad of said first semiconductor chip and said at least one first electrode pad of said second semiconductor chip by a bonding wire.

2. The semiconductor device as claimed in claim 1, wherein a plurality or said first electrode pads of said first semiconductor chip are provided and a plurality of said first electrode pads of said second semiconductor chip are provided; and said inductor is formed by alternately and sequentially connecting said first electrode pads of said first semiconductor chip and said first electrode pads of said second semiconductor chip by bonding wires.

3. A semiconductor device comprising:

a semiconductor chip having a plurality of circuit blocks, a power supply line and a ground line, said power supply line and said ground line being connected to each of said plurality of circuit blocks; and a condenser chip having a plurality of condensers, wherein said condenser chip is stacked on said semiconductor chip, and wherein said plurality of condensors are provided corresponding to the respective circuit blocks and each of said plurality of condensers connects said power supply line and said ground line to function as a noise reduction condenser.

4. The semiconductor device as claimed in claim 3, wherein the noise reduction condenser or said condenser chip is formed by a MOS capacity.

5. A semiconductor device as claimed in claim 3, wherein said power supply line and said ground line each have a ring shaped configuration, said plurality of circuit blocks are formed inside said ring shaped power supply line and ground line, and each of said plurality of condensers is connected to the corresponding circuit block through an electrode pad provided on a connecting line which connects the corresponding circuit block and one of said ring shaped power supply line and ground line.

6. A semiconductor device comprising:

a semiconductor chip having a plurality of circuit blocks, a power supply line and a ground line, said power supply line and said ground line being connected to each of said plurality of circuit blocks; and a plurality of condenser chips, each of which has a condenser, wherein said condenser chip in stacked on said semiconductor chip, and wherein said plurality of condensers are provided corresponding to the respective circuit blocks and each of the condensers of said plurality of condenser chip connects said power supply line and said ground line to function as a noise reduction condenser.

7. The semiconductor device as claimed in claim 6, wherein the noise reduction condenser of said condenser chip is formed by a MOS capacity.

8. The semiconductor device as claimed in claim 6, wherein said power supply line and said ground line have a ring shaped configuration, said plurality of circuit blocks are formed inside said ring shaped power supply line and said ground line, and each of the condensers is connected to the corresponding circuit block through an electrode pad provided on connecting line which connects the corresponding circuit block and one of said ring shaped power supply line and ground line.

9. A semiconductor device comprising:

a semiconductor chip having a circuit block, a power supply line and a ground line, said power supply line and said ground line being connected to said circuit block; and a condenser chip having a condenser, wherein said condenser chip is stacked on said semiconductor chip, and wherein said semiconductor chip has a first electrode pad provided on a connecting line which connects said circuit block and one of said power supply line and said ground line, and said condenser chip has a second electrode pad connected to said condenser; and wherein said first electrode pad is electrically connected to said second electrode pad through a bonding wire so that said condenser function as a noise reduction condenser.

10. The semiconductor device as claimed in claim 9, wherein the noise reduction condenser of said condenser chip is formed by a MOS capacity.

11. The semiconductor device as claimed in claim 9, wherein said semiconductor chip has a third electrode pad other than said first electrode pad connected to said circuit block, said third electrode pad being separated from said circuit block;

said condenser chip has a fourth electrode pad other than said second electrode pad connected to said condenser, said fourth electrode pad being separated from said condenser, and an inductor is formed by connecting said third electrode pad, said fourth electrode pad and one of said power line and said ground line through a bonding wire to function as a noise reduction inductor.

12. The semiconductor device as claimed in claim 11, wherein a plurality of said third electrode pads are provided for said semiconductor chip and a plurality of said fourth electrode pads are provided for said condenser chip; and said inductor is formed by alternately and sequentially connecting said third electrode pads and said fourth electrode pads through bonding wires.

13. A semiconductor device comprising:

a semiconductor chip having a circuit block, a power supply line and a ground line, said power supply line and said ground line being connected to said circuit block; and a condenser chip having a condenser, wherein said condenser chip is stacked on said semiconductor chip, wherein said semiconductor chip has a first electrode pad provided on a connecting line which connects said circuit block and one of said power supply line and said ground line, and said condenser chip has a second electrode pad connected to said condenser; and wherein said first electrode pad is electrically connected to said second electrode pad by flip chip bonding so that said condenser functions as a noise reduction condenser.

14. The semiconductor device as claimed in claim 13, wherein the noise reduction condenser of said condenser of said condenser chip is formed by a MOS capacity.

* * * * *